(12) United States Patent  
Nagarajan et al.

(10) Patent No.: US 8,994,568 B2  
(45) Date of Patent: Mar. 31, 2015

(54) METHOD AND APPARATUS FOR CLOSED LOOP CONTROL OF SUPPLY AND/OR COMPARATOR COMMON MODE VOLTAGE IN A SUCCESSIVE APPROXIMATION REGISTER ANALOG TO DIGITAL CONVERTER

(71) Applicant: QUALCOMM Incorporated, San Diego, CA (US)

(72) Inventors: Karthik Nagarajan, Santa Clara, CA (US); Dinesh J Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 14 days.

(21) Appl. No.: 13/782,335

(22) Filed: Mar. 1, 2013

(65) Prior Publication Data

US 2014/0247170 A1 Sep. 4, 2014

(51) Int. Cl.
*H03M 1/12* (2006.01)
*H03M 1/06* (2006.01)
*H03M 1/00* (2006.01)
*G06F 1/32* (2006.01)
*H03M 1/46* (2006.01)

(52) U.S. Cl.
CPC . *H03M 1/12* (2013.01); *H03M 1/00* (2013.01); *G06F 1/3296* (2013.01); *H03M 1/0604* (2013.01); *H03M 1/46* (2013.01)
USPC .......................................... 341/155; 341/120

(58) Field of Classification Search
CPC .................................. H03M 1/12; H03M 1/00
USPC .................................. 341/156, 155, 120, 118
See application file for complete search history.

(56) References Cited

U.S. PATENT DOCUMENTS

| 7,142,009 | B1 | 11/2006 | Watt et al. |
| 7,405,689 | B2* | 7/2008 | Kernahan et al. ............. 341/156 |
| 7,821,441 | B2 | 10/2010 | Westwick et al. |
| 8,193,957 | B2 | 6/2012 | Yoshioka |
| 2012/0032824 | A1 | 2/2012 | Yoshioka |
| 2012/0061555 | A1 | 3/2012 | Ay |

FOREIGN PATENT DOCUMENTS

WO 9806022 A2 2/1998

OTHER PUBLICATIONS

AY, "A sub-1 Volt 10-bit supply boosted SAR ADC design in standard CMOS," Analog Integrated Circuits and Signal Processing, 66(2), (Feb. 2011), pp. 213-221.

(Continued)

*Primary Examiner* — Joseph Lauture
(74) *Attorney, Agent, or Firm* — Arent Fox LLP (57) ABSTRACT

A method and apparatus for controlling supply voltage for a successive approximation register analog to digital converter and comparator common mode voltage. The method comprises: measuring a successive approximation register conversion time; comparing the successive approximation register conversion time with a desired conversion time; and if necessary, performing a closed loop adjustment of at least one of the supply and/or comparator common mode voltage. The apparatus consists of a common mode voltage and regulator correction module. The common mode voltage and regulator correction module includes a phase frequency detector, a charge pump and may include a transconductance cell.

16 Claims, 12 Drawing Sheets

(56) References Cited

OTHER PUBLICATIONS

National Semiconductor Corporation: "LMV7235/LMV7239 45ns, Ultra Low Power Low Voltage, Rail-to-Rail Input Comparator with Open-Drain/Push-Pull Output", Internet Citation, Feb. 2002, XP002386509, p. 8. Retrieved from the Internet: URL:http :jjwww. fulcrum. rujRead/CDROMsjNS-2 003 .Februaryjpdfjnsc06454.pdf. International Search Report and Written Opinion—PCT/US2014/017821—ISA/EPO—Jun. 11, 2014.

* cited by examiner

METHOD AND APPARATUS FOR CLOSED LOOP CONTROL OF SUPPLY AND/OR COMPARATOR COMMON MODE VOLTAGE IN A SUCCESSIVE APPROXIMATION REGISTER ANALOG TO DIGITAL CONVERTER

BACKGROUND

1. Field

The present disclosure relates to methods and apparatus for closed loop control or supply and/or comparator common mode voltage of a successive approximation register (SAR). A method and apparatus for improving SAR analog to digital converter (ADC) performance by controlling the SAR supply and comparator common mode voltage is provided.

2. Background

Wireless communication devices have become smaller and more powerful, as well as more capable. Increasingly users rely on wireless communication devices for many of their day to day activities like checking email, accessing internet, as well as staying in touch. This has increased the burden on these devices and requires these devices to handle larger data, at higher speeds. In other words, increasing usage has increased the bandwidth requirement on wireless devices and also on the blocks used in wireless signal chain. A wireless receiver typically consists of low noise amplifier, a mixer, a baseband filter followed by an ADC (analog to digital converter). An analog to digital converter (ADC) is used to convert the incoming analog signals to a digital signal. Increasing the bandwidth, of a wireless system, requires ADC to operate at higher clock speeds. The methods and apparatus described herein enables an ADC to operate at higher clock speeds and thus improves the bandwidth of the wireless system. These techniques also apply to improving the performance of ADCs used in other applications.

Successive approximation ADC (SAR) topology is increasingly becoming the choice for ADCs used in many wireless systems. It has the advantage of scaling well with smaller geometry digital process and also consumes lower power than other ADC topologies. These features and advantages make it attractive for mobile wireless and other devices that must provide good performance with low power consumption. A SAR ADC that provides 'N-bit' output must to complete N-conversions, one after another, within one clock cycle. The time it takes the ADC to complete all N conversions is known as the conversion time and varies with process corner, temperature, and voltage. The voltages that control the speed of a SAR ADC are the supply voltage and the comparator common mode voltage. These voltages are designed for a nominal value, but they typically change above and below this value. In the slow corner of the operating envelope, such as occurs with extreme temperatures, if the supply voltage and/or the comparator common mode voltage is low, the SAR ADC will slow down and will not operate quickly enough to complete all conversions required by the clock speed of the operating system. This becomes a problem when trying to increase the clock frequency of a SAR ADC as high as possible. Merely programming these voltages higher does not solve the problem, as random variations, in addition to the increased voltage cause decreased reliability. In addition, setting the voltage higher increases the power consumption of the SAR ADC in other process corners where higher voltage is not needed. The ADC ends up using more power than needed.

To overcome this problem, SAR conversions could be stopped before completing all N conversions. However, this causes loss of accuracy. In other cases, the clock speed of SAR ADC can be reduced to accommodate the reduction in speed. This in turn will limit the signal bandwidth for which SAR ADC can be used.

There is a need in the art for methods and apparatus for improving SAR ADC performance by adaptively controlling voltages in SAR ADC, increasing only when it is slow and leaving it unchanged or reducing it when fast. In addition to improving performance in the slow corner, the methods and apparatus described herein also helps save power in typical and fast corners.

SUMMARY

Embodiments described herein provide a method for controlling supply voltage for a successive approximation register analog to digital converter and comparator common mode voltage. The method comprises: measuring a successive approximation register conversion time; comparing the successive approximation register conversion time with a desired conversion time; and if necessary, performing a closed loop adjustment of at least one of the supply and/or comparator common mode voltage.

An additional embodiment provides an apparatus for controlling the supply voltage for a successive approximation register analog to digital converter and the comparator common mode voltage. The apparatus consists of a common mode voltage and regulator correction module. The common mode voltage and regulator correction module includes a phase frequency detector, a charge pump and may include a transconductance cell.

A further embodiment provides an apparatus for controlling supply voltage for a successive approximation register analog to digital converter and comparator common mode voltage. The apparatus comprises: means for measuring a successive approximation register conversion time; means for comparing the successive approximation register conversion time with a desired conversion time; and if necessary, means for performing a closed loop adjustment of at least one of the supply and/or comparator common mode voltage. A still further embodiment provides a non-transitory computer readable medium containing instructions, which when executed cause a processor to perform the steps of: measuring a successive approximation register conversion time; comparing the successive approximation register conversion time with a desired conversion time; and if necessary, performing a closed loop adjustment of at least one of the supply and/or comparator common mode voltage.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used herein, the term "determining" encompasses a wide variety of actions and therefore, "determining" can include calculating, computing, processing, deriving, investigating, looking up (e.g., looking up in a table, a database or another data structure), ascertaining and the like. Also, "determining" can include resolving, selecting choosing, establishing, and the like.

The phrase "based on" does not mean "based only on," unless expressly specified otherwise. In other words, the phrase "based on" describes both "based only on" and "based at least on."

Moreover, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The various illustrative logical blocks, modules, and circuits described in connection with the present disclosure may be implemented or performed with a general purpose processor, a digital signal processor (DSP), an application specific integrated circuit (ASIC), a field programmable gate array (FPGA), or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM, and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Embodiments described herein incorporate a SAR ADC. A brief description of a SAR ADC is needed in order to better understand the embodiments presented in the disclosure.

Figure 1:
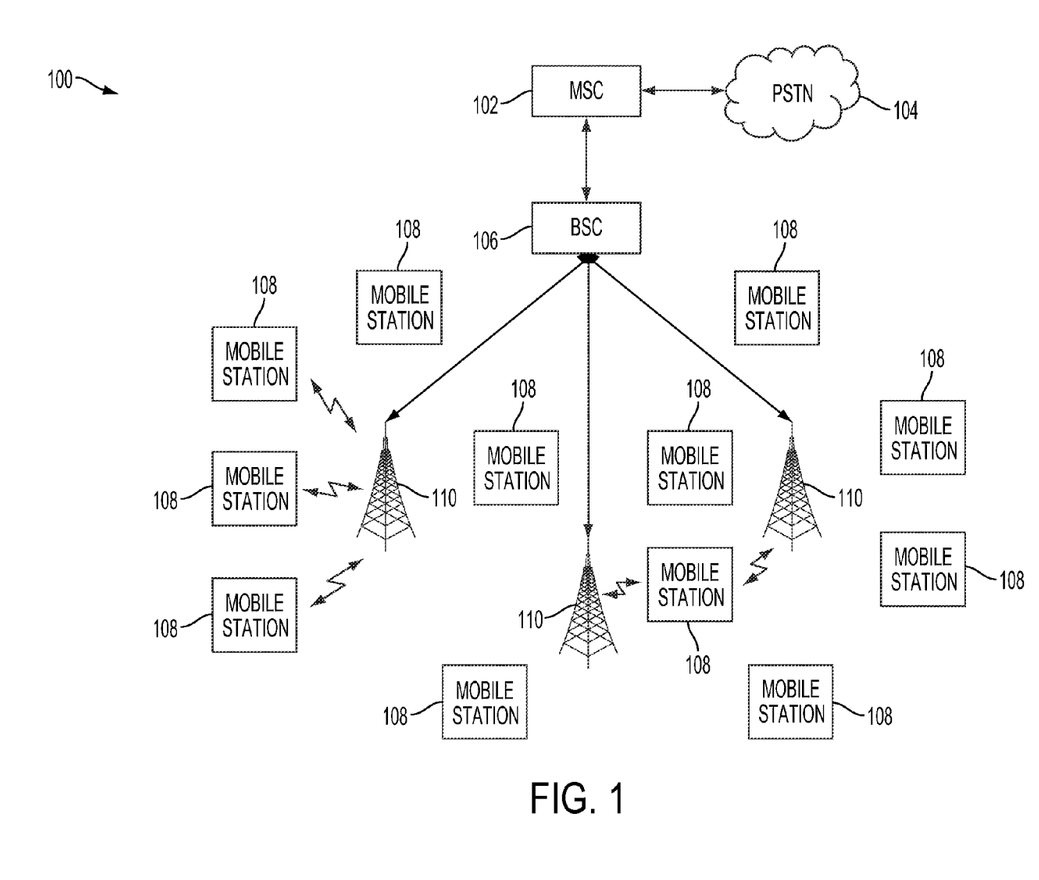
FIG. 1 illustrates one configuration of a wireless communication system, in accordance with certain embodiments of the disclosure.

FIG. 1 illustrates a wireless system 100 that may include a plurality of mobile stations 108, a plurality of base stations 110, a base station controller (BSC) 106, and a mobile switching center (MSC) 102. The system 100 may be GSM, EDGE, WCDMA, CDMA, etc. The MSC 102 may be configured to interface with a public switched telephone network (PTSN) 104. The MSC may also be configured to interface with the BSC 106. There may be more than one BSC 106 in the system 100. Each base station 110 may include at least one sector, where each sector may have an omnidirectional antenna or an antenna pointed in a particular direction radially away from the base stations 110. Alternatively, each sector may include two antennas for diversity reception. Each base station 110 may be designed to support a plurality of frequency assignments. The intersection of a sector and a frequency assignment may be referred to as a channel. The mobile stations 108 may include cellular or portable communication system (PCS) telephones.

During operation of the cellular telephone system 100, the base stations 110 may receive sets of reverse link signals from sets of mobile stations 108. The mobile stations 108 may be involved in telephone calls or other communications. Each reverse link signal received by a given base station 110 may be processed within that base station 110. The resulting data may be forwarded to the BSC 106. The BSC 106 may provide call resource allocation and mobility management functionality including the orchestration of soft handoffs between base stations 110. The BSC 106 may also route the received data to the MSC 102, which provides additional routing services for interfacing with the PSTN 104. Similarly, the PTSN 104 may interface with the MSC 102, and the MSC 012 may interface with the BSC 106, which in turn may control the base stations 110 to transmit sets of forward link signals to sets of mobile stations 108.

Figure 2:
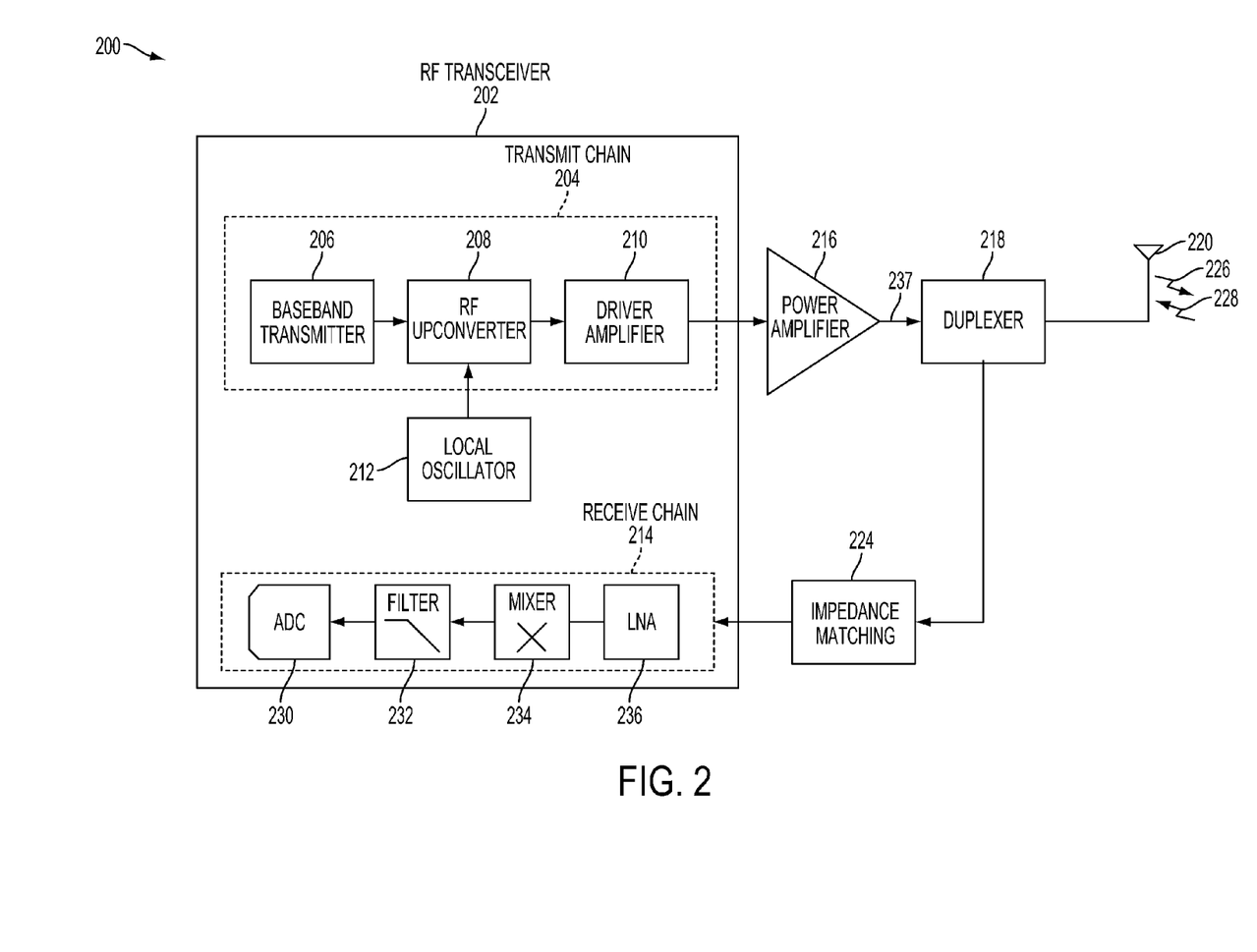
FIG. 2 illustrates a block diagram of an example of electronic components capable of transmitting in accordance with certain embodiments of the disclosure.

FIG. 2 is a block diagram illustrating one example of electronic components, 200, capable of transmitting. The electronic components 200 may be part of a mobile station 108, a base station 110, or any other type of device that may transmit. The electronic components 200 may include a power amplifier (PA) 216. In one scenario the tests may be conducted before the components 200 are marketed, that is, before an end user acquires the components 200. Individual components illustrated in FIG. 2 may also be tested prior to assembly into the portable electronic device. The device may be further tested once assembled. In one example, the configuration 200 may include a radio frequency (RF) transceiver 202. The transceiver 202 may transmit outgoing signals 226 and receive incoming signals 228 via an antenna 220. A transmit chain 204 may be used to process signals that are to be transmitted and a receive chain 214 may be implemented to process signals received by the transceiver 202. An incoming signal 228 may be processed by a duplexer 218 and impedance matching 224 of the incoming signal 228 may occur. The incoming signal 228 may then be processed by the receive chain 214.

Transmit chain 204 prepares signals for transmission by the antenna 220. Transmit chain 204 includes baseband transmitter 206, RF upconverter 208, and driver amplifier 210. The baseband transmitter 206 may also include a filter (not shown) to filter out noise that may be associated with the signal. The signal to be transmitted is prepared by the baseband transmitter 206 and may be upconverted to a high frequency signal by an RF upconverter 208. The upconverter 208 may be under the control of a local oscillator 212. A driver amplifier 210 may amplify the signal and the signal may pass through the PA 216.

In one configuration, the signal to be transmitted may be fed through the transmit chain 204 as described above, into the PA 216, and PA output 237 may be passed through a duplexer 218. The duplexed signal 239 may be measured (rather than measuring the output signal 226 from the antenna 220) as part of a testing process for the completed wireless communication device. During the testing of PA 216, measuring equipment 230 may be connected to the output of the duplexer 218 (i.e., the duplexed signal 239). The equipment 230 may include amplitude measuring equipment or functionality 232 and phase measuring equipment or functionality 234. The measuring equipment 230 may be implemented by a computing device that includes a processor, memory, a display, communication interfaces, and the like. The block diagrams of FIGS. 6 and 7 illustrate these components in the context of a wireless device and a base station.

The RF transceiver 202 also includes receive chain 214. Receive chain 214 includes low noise amplifier (LNA) 236. LNA 236 receives the signal after impedance matching device 224 has processed the received signal. LNA 236 amplifies the received signal and passes it to mixer 234 for mixing. The filter 232 receives the signal from the mixer and removed undesired signal products. After filtering the signal is sent to the analog-to-digital converter (ADC) 230 for conversion.

Figure 3:
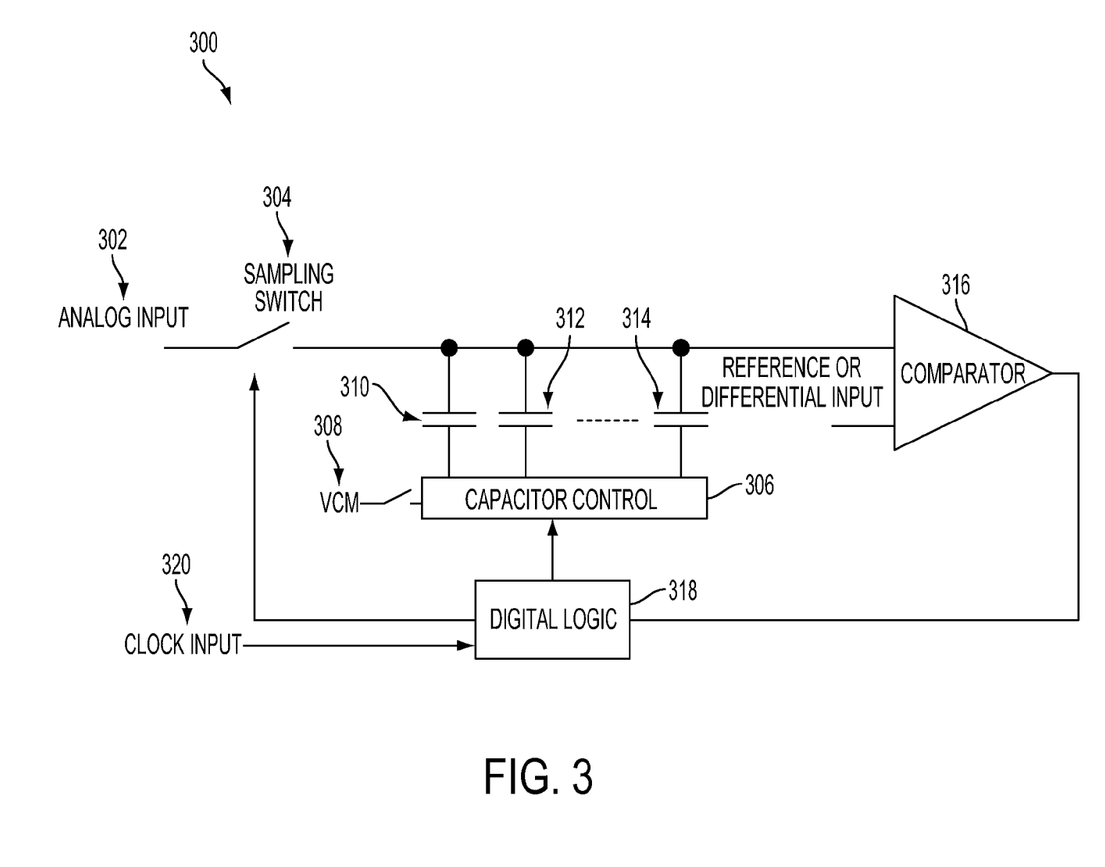
FIG. 3 depicts a successive approximation register (SAR) assembly, according to embodiments of the disclosure.

FIG. 3 illustrates a SAR ADC assembly, 300. A SAR ADC operates on the input analog voltage and converts that voltage to an N-bit digital output in a sequential manner. It typically consists of a binary weighted array of resistors or capacitors, or may use a combination of the two. In FIG. 3, the array uses capacitors 310, 312, and 314. These capacitors are connected to capacitor control logic 306. Comparator 316 and digital logic 318 control operation of the SAR ADC. An input signal is first sampled through sampling switch 304. The switch 304 is turned off and comparator 316 is enabled for the first conversion. In a single-ended implementation a sampled input signal can be compared to a reference voltage. In a differential implementation two, one positive and one negative, input signals may be compared to one another. At first, conversion comparator output determines the most significant bit (MSB) of digital output. Depending on the output of comparator 316, digital logic 318 adjusts its input for the next conversion. For example, if the output is high, indicating that the sampled input is higher than the reference voltage, digital logic 318 adjusts the reference voltage higher for the next conversion. Similarly, in differential implementation, the differential voltage at comparator 316 is adjusted lower. If the output is low, then the reference or differential voltage will be adjusted higher for the next conversion. After adjusting comparator 316 input, digital logic 318 enables comparator 316 for the next conversion. Comparator 316 output after the second conversion determines the (MSB−1) bit.

This sequence is repeated until all "N" conversions are completed, one after another. Comparator 316 output for the last conversion determines the least significant bit (LSB). Once all N conversions are completed, digital logic 318 turns on the sampling switch 304 to sample the analog input for the next conversion. The sequence of N conversion is then repeated for the next analog input. The sampling rate, or, how often the input signal 302 is sampled is determined by clock input 320. The frequency of this clock sets the sampling rate of the SAR ADC.

For normal operation of the SAR ADC sufficient time should be given to complete all N conversions and sample the next analog input within one clock period. ($T_{PERIOD}$). In other words, the clock frequency should be low enough to allow the SAR to complete the conversions and sample the input.

Figure 4:
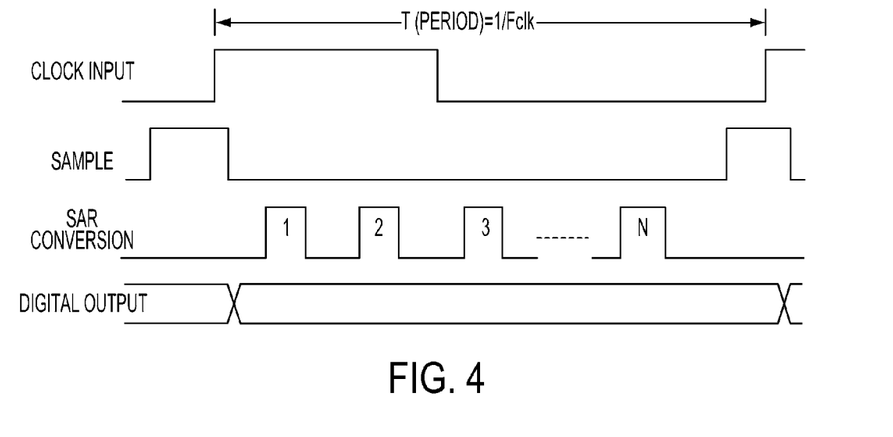
FIG. 4 shows the SAR conversion waveform, in accordance with embodiments of the disclosure.

FIG. 4 illustrates the SAR conversion waveform described above and illustrates the relationship of the samples to the clock period.

Figure 5:
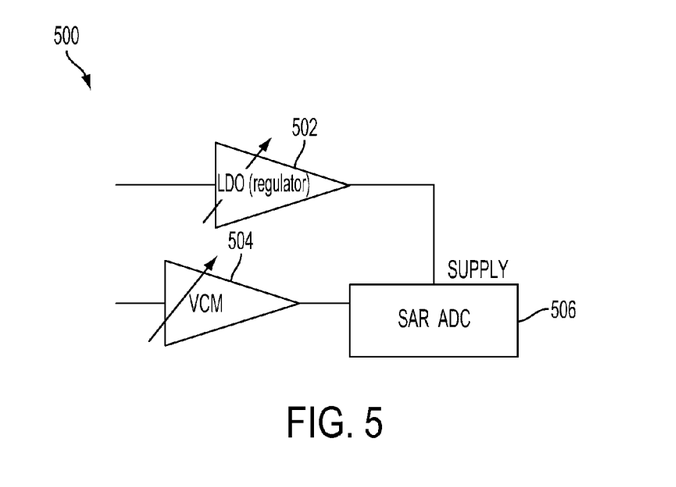
FIG. 5 depicts a SAR analog to digital converter (ACD) control with regulator voltage and voltage control module (VCM), according to embodiments of the disclosure.

FIG. 5 depicts a SAR ADC, with the supply voltage is set by a regulator (502) and comparator common mode voltage is set by VCM (504) block. The comparator 316 common mode voltage is set during the sampling phase by VCM 504.

Figure 6:
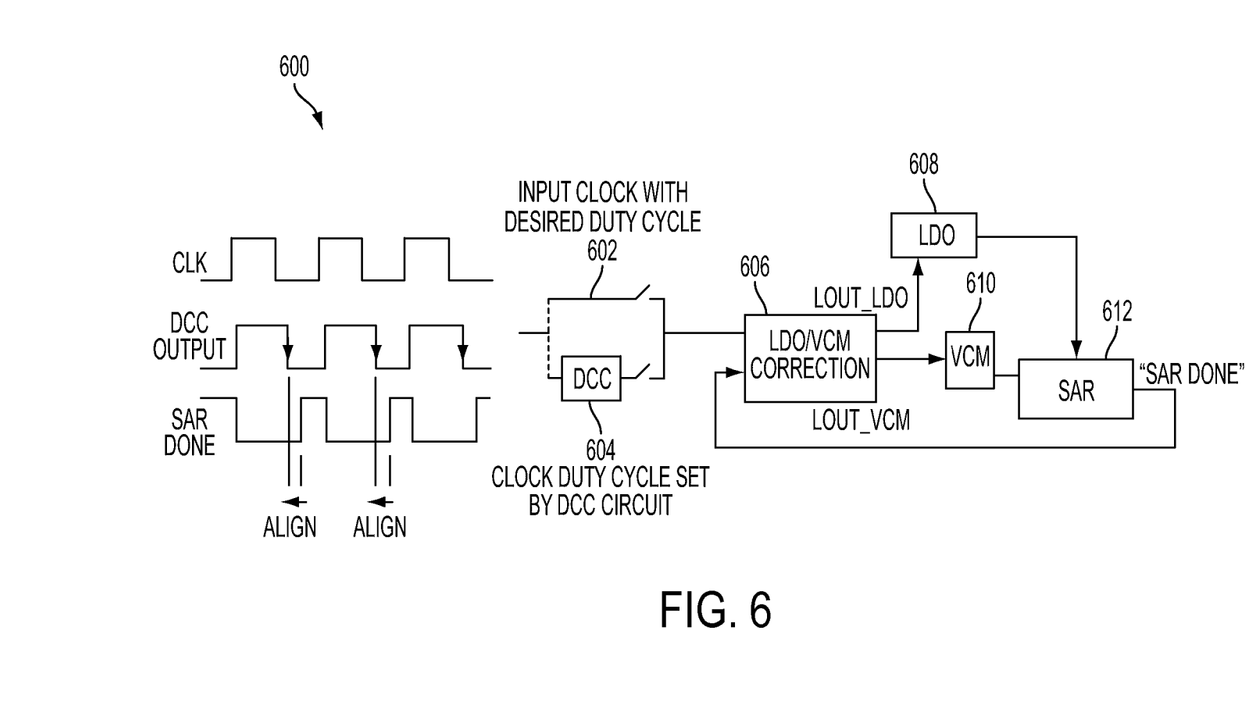
FIG. 6 illustrates an assembly for performing closed loop control of supply and/or comparator voltage according to an embodiment of the disclosure.

FIG. 6 depicts an assembly 600. By treating SAR as a voltage controlled delay line, its speed may be controlled in a closed loop system as described below. A LDO/VCM correction block is used to monitor and correct the speed of SAR ADC. A reference clock edge is provided to LDO/VCM correction block (606). If the input clock has desired duty cycle, then one of the edges of the input clock can be used as reference clock (602) or a duty cycle correction circuit (DCC 604) can be used to generate the clock with desired duty cycle for the reference edge. The LDO/VCM correction block provides output to low dropout regulator (LDO) 608 and VCM (610).

In the method, the SAR 612 speed is compared with the reference clock edge, which may be input clock 602 or DCC clock 604.

When the SAR 612 is not operating fast enough, whether because the regulator or common mode voltage (VCM) is low, the circuit 600 detects the slowness of the SAR 612 and automatically increases the voltage until the SAR 612 is operating at the desired speed. The assembly 600 of FIG. 6 may also limit the amount that the voltage is allowed to increase, thus avoiding reliability problems. The method allows for controlling regulator (LDO) and VCM voltage together or either voltage separately, depending on need. The method may be used for ADC applications, but may also be used in any delay based circuit or processing circuit working at high clock speeds.

Figure 7:
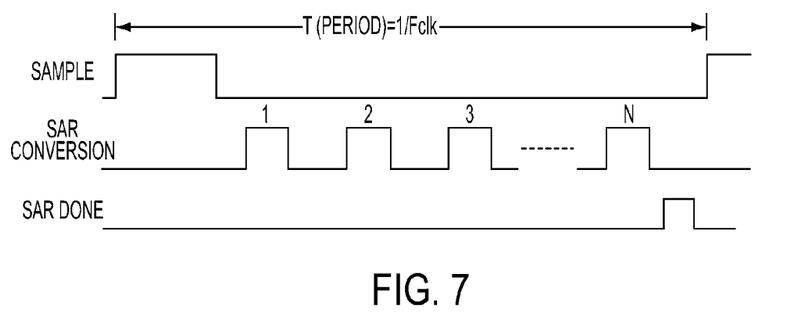
FIG. 7 illustrates the relationship of the N-bit conversions the SAR ADC should complete in a clock period according to an embodiment of the disclosure.

FIG. 7 shows the relationship between the sampling pulse, number of conversions that an N-bit SAR ADC should complete within a clock period, and 'SAR done' signal, which indicates completion of conversions. One drawback of SAR topology is that as clock frequency increases the time available for N conversions decreases. This creates a problem as all N conversions may not be completed within one clock cycle. A further problem is that conversion speed is slower at the slow process corner, at extreme temperatures, and at lower voltages. The result is incorrect output produced by the SAR ADC. The embodiment described above in FIG. 6 addresses these problems.

Figure 8:
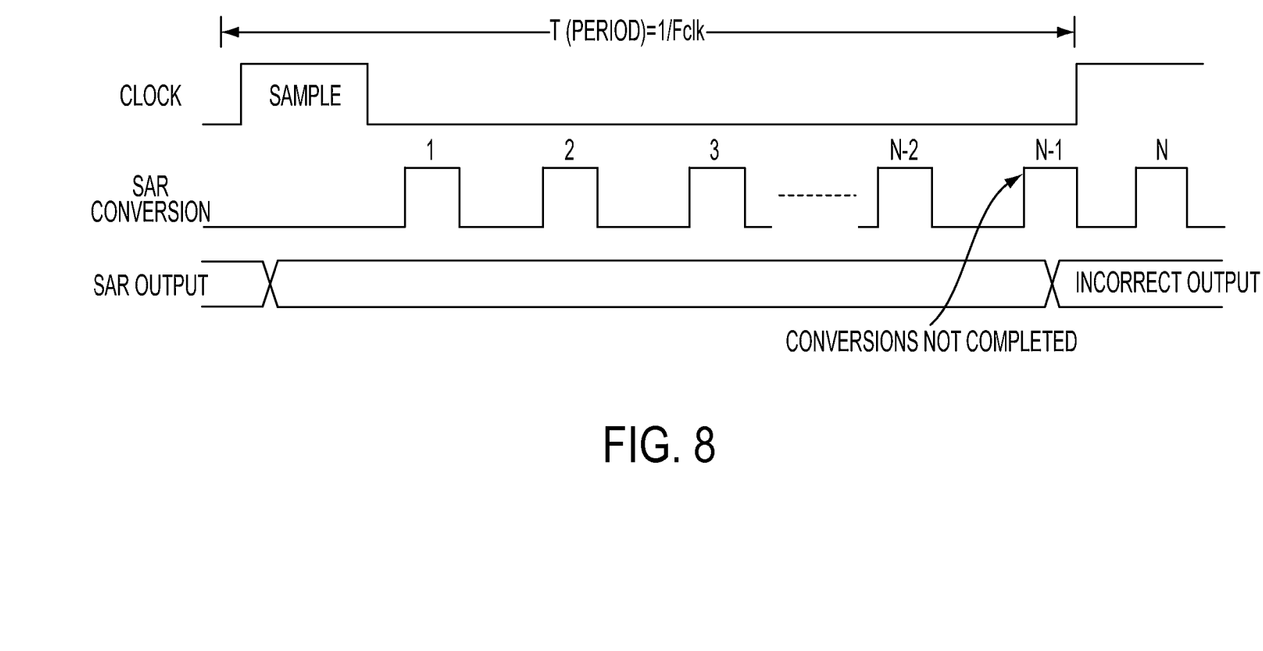
FIG. 8 illustrates the problem of lowered clock speeds to complete the needed number of conversions.

FIG. 8 illustrates the problem of conversions not being completed within the clock time period. To overcome the speed issue of a SAR ADC the clock speed may be reduced. This guarantees that all conversions will be completed in all corners. However, this option lowers the specified frequency of operation. An alternative solution is to reduce the number of bits "N" in the SAR ADC to guarantee that conversions will be completed in all corners, temperatures, and voltages. However, this choice also results in lowering the specification of the SAR ADC, and may be unacceptable for some applications.

The speed of the SAR ADC may be maximized by allowing the comparator 316 and digital logic 318 to operate as fast as possible. In embodiments, the speed of these two blocks may be controlled or adjusted using the supply voltage and the common mode voltage of comparator 316. Further embodiments described below detail how these voltages are controlled to improve the speed of the SAR ADC.

Figure 9:
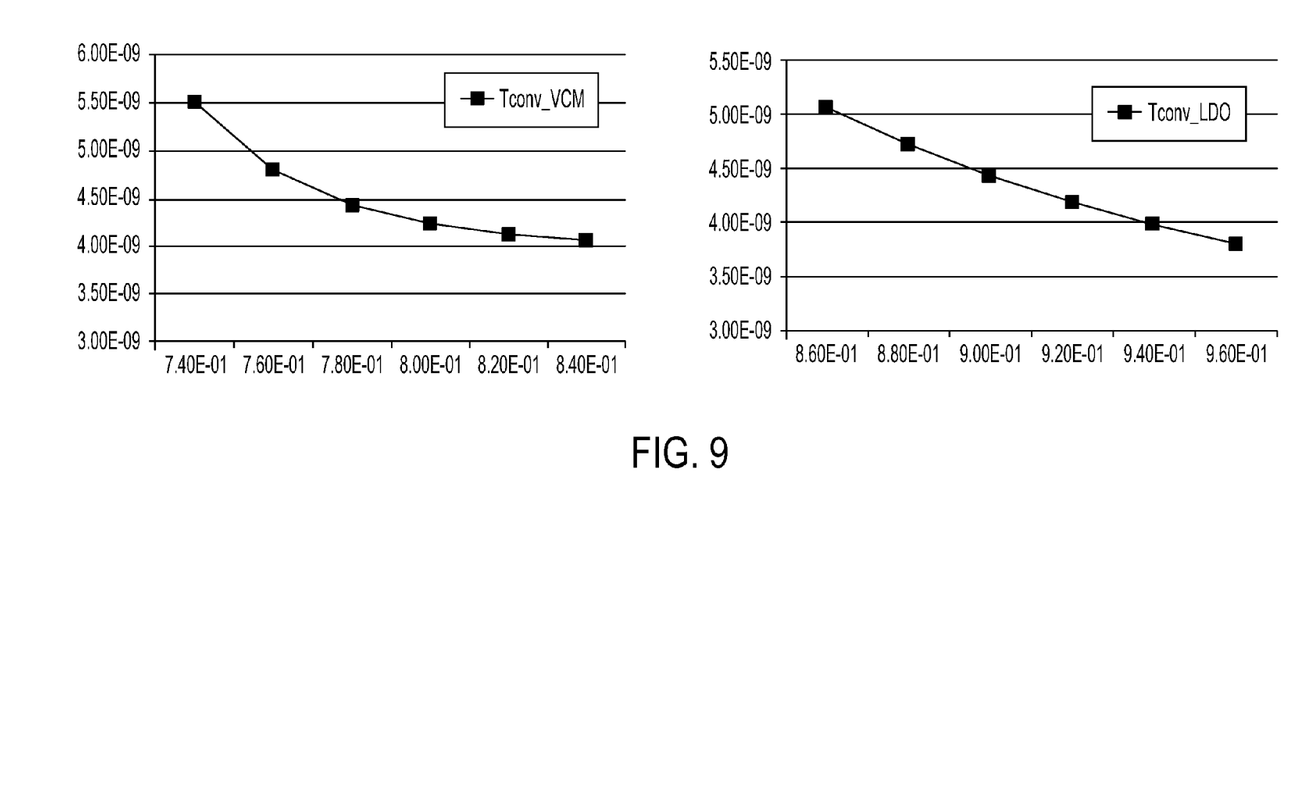
FIG. 9 shows the relationship between conversion time and supply and comparator common mode voltage according to embodiments of the disclosure.

FIG. 9 depicts how the conversion time varies with the comparator common mode voltage and regulator voltage. Since SAR conversion time depends on supply and comparator common mode voltage, SAR ADC may be treated as a voltage controlled delay line with two inputs. Change in conversion time when the control voltage changes by 1 volt, $\Delta t/\Delta v$ (KDL) is comparable for the two control voltages, regulator as well as comparator common mode voltage.

Figure 10:
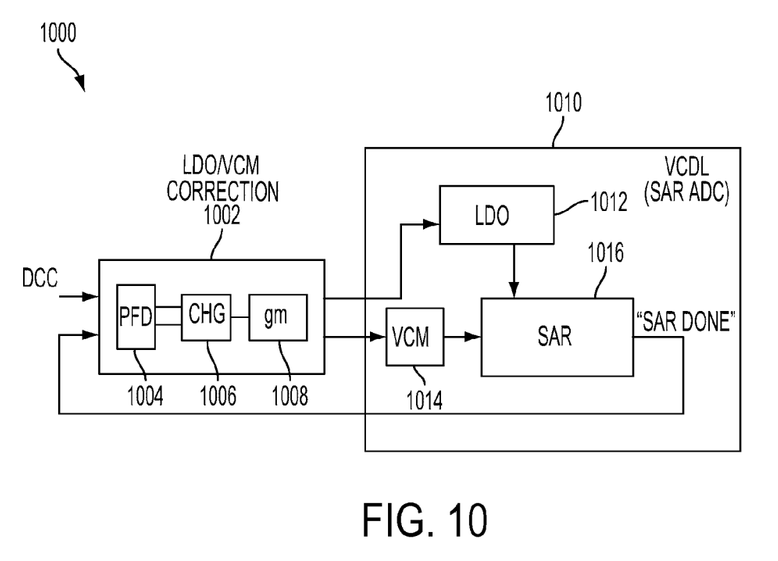
FIG. 10 depicts an assembly for closed loop adjustment of SAR speed according to an embodiment of the disclosure.

FIG. 10 shows an assembly 1000 for closed loop adjustment of SAR speed along with individual blocks inside LDO/VCM correction circuit. In particular, FIG. 10 shows how SAR speed may be adjusted in a closed loop fashion. Assembly 1000 includes a module 1002 which contains provisions for VCM and LDO correction. A phase detector (PD) 1004 is connected to a charge pump (CHG) 1006, which is in turn connected to a transconductance (gm) CELL 1008. Output from module 1002 is input to SAR ADC module 1010. Two inputs are made to SAR 1010 from the VCM and LDO correction module 1002, one input is provided to LDO 1012 while the other is provided to VCM 1014.

The PD compares a reference edge with the SAR 1016 "done" signal. The SAR 1016 "done" signal is a signal from a state machine inside SAR ADC 1010 that indicates that all of the conversions have been completed. When the SAR is slower than the desired speed, the 'SAR done' signal arrives later than the reference edge and when the SAR is faster than desired speed this edge arrives earlier than reference edge. The PD 1004 generates an output pulse whose width depends on the delay between the edges of DCC and the SAR "done" signal. The PD may be implemented by modifying a typical PFD to incorporate an additional reset signal. This additional reset signal makes the PFD function as a phase detector. The charge pump 1006 acts as an integrator whose output voltage increases as long as the SAR "done" edge is later than the DCC edge. A gm cell 1008, used to convert charge pump output voltage to current, is added between charge pump 1006 and the SAR ADC 1010.

Figure 11:
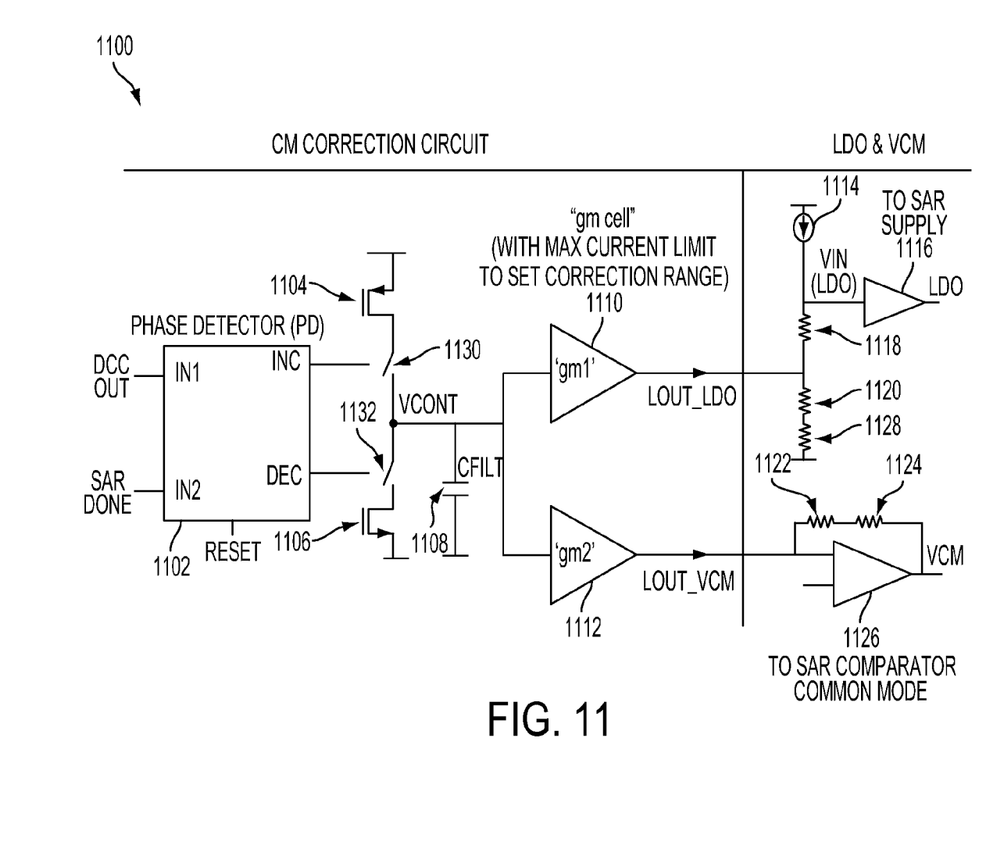
FIG. 11 is a block diagram of the closed loop control apparatus according to an embodiment of the disclosure.

As long as 'SAR done' edge is later than the reference edge, the charge pump voltage continues to increase. As the voltage increases, the current output from 'gm' cell also increases. This current will increase the LDO voltage and/or common mode (VCM) voltage. Thus making the SAR ADC complete the conversions faster. The closed loop system or feedback will reach a stable state when 'SAR done' edge and reference edge are both aligned, i.e., when SAR completes the conversions within the given time. FIG. 11 provides a block diagram of the closed loop control apparatus 1100. The assembly includes a phase detector 1102. PD 1102 has a first input that accepts a DCC output. A second input receives the SAR "done" signal. A reset mechanism is also provided on PD 1102. PD 1102 provides two outputs. The increase (INC) output is connected to switch 1130, when INC output is high, this will cause current to charge the capacitor CFILT 1108, increasing the voltage VCONT. Similarly, the decrease (DEC) output is provided through switch 1132, when DEC output is high, current is drawn from capacitor CFILT, thus decreasing the voltage VCONT. Both of these paths connect at VCONT and are also connected to capacitor 1008.

Both 'gm' cells 1110 & 1112 provide a current output. First 'gm' cell (1110) provides a current output to input branch of the LDO circuit. Second 'gm' cell provides current output to VCM circuit. (Paragraph below moved to section that describes FIG. 12)

Figure 12:
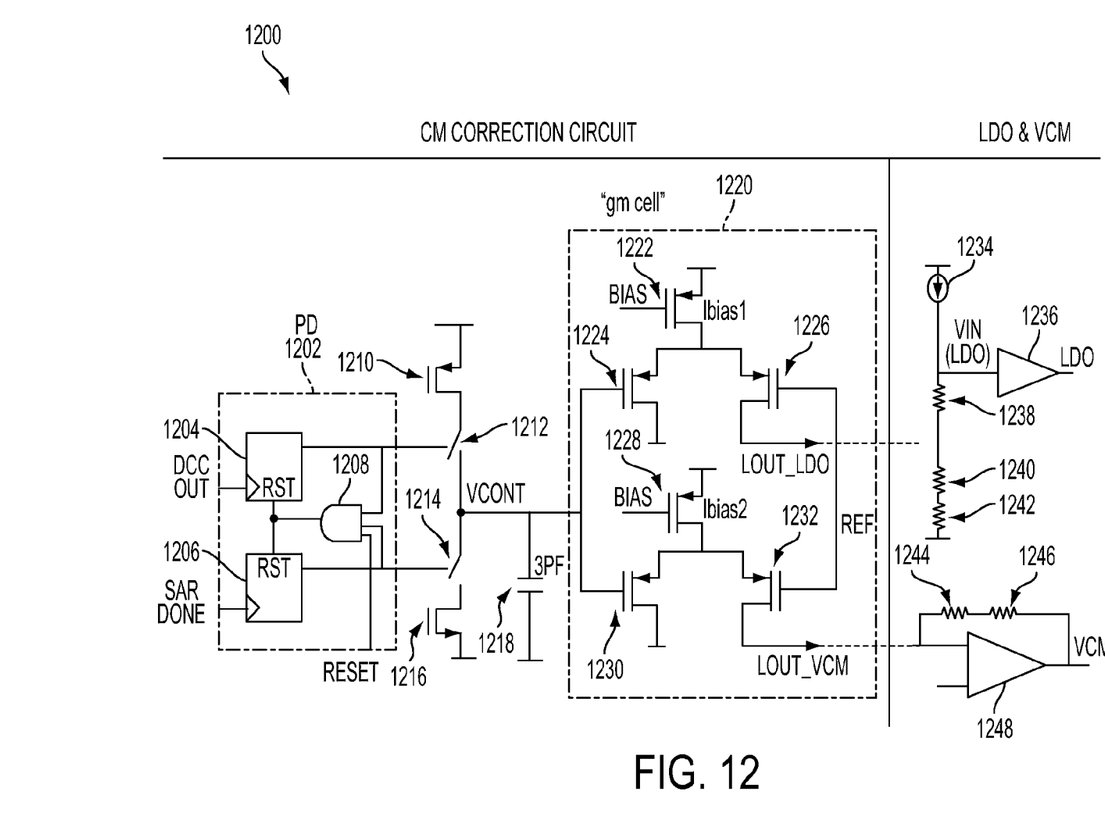
FIG. 12 illustrates a circuit diagram of a closed loop control apparatus incorporating a transconductance cell, according to an embodiment of the disclosure.

FIG. 12 provides a circuit diagram of for one possible implementation of PD block and transconductance cell. Assembly 1200 includes PD 1202. The PD includes flip-flops 1204 and 1206. Flip flops 1204 and 1206 are both connected to a three input AND gate 1208. One input of AND gate 1208 is also connected to an output of flip-flop 1204. This output is then connected to a switch 1212. Switch 1212 also is connected to a current source, which may be a PMOS device.

A second input of the AND gate 1208 is connected to an output from flip-flop 1206. This output is connected to switch 1214. Switch 1214 is connected to another current source, which may be a NMOS device. 1216. $V_{CONT}$ is connected to capacitor 1218 and is also input to gm cell 1220.

The gm cell 1220 incorporates a p-type CMOS transistor 1224 that is connected to a second p-type CMOS transistor 1222. Both transistors 1222 and 1224 are connected to a third transistor, 1226, which is a p-type CMOS transistor. The input to gm cell 1220 is also sent to a fourth transistor 1230, which is a p-type CMOS transistor. Transistor 1230 is also connected to transistors 1228 and 1232. Transistor 1228 is a p-type CMOS transistor, while transistor 1232 is a p-type CMOS transistor. The output of gm cell 1220 is provided to VCM 1248. Resistors 1244 and 1246 are also provided before and after VCM 1248.

The LDO 1236 receives direct current input 1234. Also input to LDO 1236 are resistors 1238, 1240, and 1242, in series.

The alternate embodiment shown in FIG. 12 incorporates a gm cell that uses a differential pair to generate a current based on the charge pump voltage. In operation, $V_{CONT}$ is compared with another reference voltage in order to control the current output from the gm cell. This current is then added to the input branch of the regulator and VCM stage. This current may be added at different points in the input resistor ladder in order to provide varying correction ranges. This embodiment increases voltage and does not provide a mechanism to decrease voltage. The correction range is limited by the bias current in the differential pair and the input resistance where current is added.

In operation, the circuit controls the SAR speed only when needed, that is, only in the slow corner. In other segments of the operating envelope, the ADC is unaffected. Current that is sourced into LDO or VCM block is limited by the bias current of differential pair. This helps to limit the correction range of the circuit thus eliminating reliability concerns.

A further embodiment may be provided by modifying the apparatus to reduce the voltage when a voltage reduction is desired. This may be achieved by changing the direction of the current added to the LDO and VCM inputs.

In operation the circuit may be used in the following modes: both LDO and VCM voltages may be controlled and changed simultaneously; either the LDO or VCM voltages may be controlled; and both the LDO and VCM voltages are controlled but are sequenced one after the other.

Figure 13:
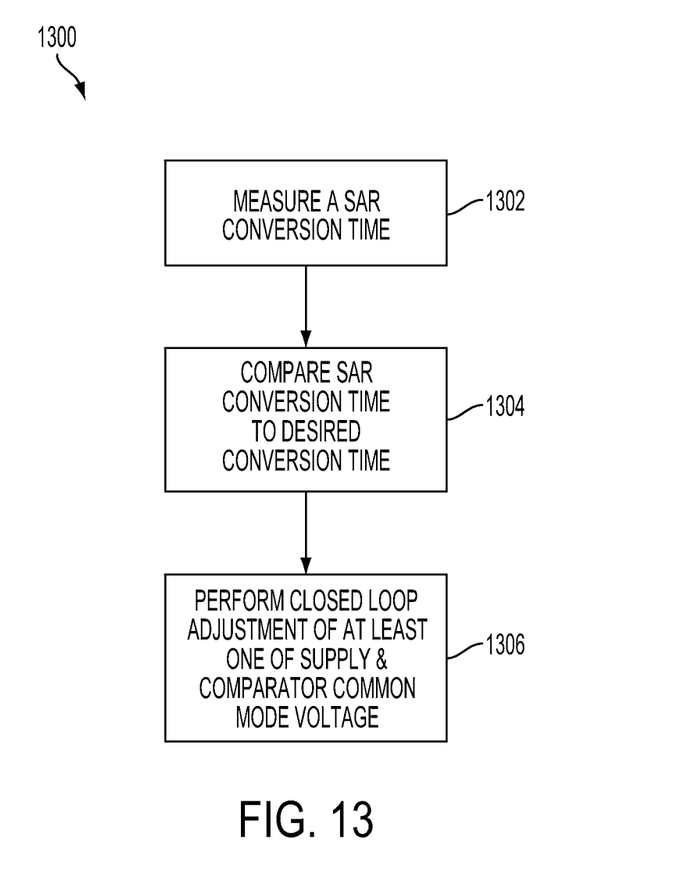
FIG. 13 is a flowchart of a method for closed loop control of supply and/or comparator common mode voltage of a SAR, according to an embodiment of the disclosure.

FIG. 13 provides a flow chart of a method for using the closed loop control apparatus described herein to perform closed loop control of supply and/or comparator common mode voltage of a SAR ADC. The method, 1300 begins with step 1302 where a SAR conversion time is measured. This measured conversion time is compared with a desired conversion time in step 1304. In step 1306 closed loop adjustment of at least one or the supply and comparator common mode voltage is performed.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for controlling supply voltage for a successive approximation register (SAR) analog to digital converter (ADC) comparator common moved voltage, comprising:
   measuring a SAR conversion time;
   comparing the SAR conversion time to a desired conversion time; and
   adjusting in closed loop fashion at least one of a supply and comparator common mode voltage.

2. The method of claim 1, wherein both the supply and the comparator common mode voltages are adjusted.

3. The method of claim 1, wherein the supply voltage is adjusted.

4. The method of claim 1, wherein the comparator common mode voltage is adjusted.

5. An apparatus for controlling supply voltage for a successive approximation register (SAR) analog to digital converter (ADC) and comparator common mode voltage comprising:
   a common mode voltage and regulator correction module, electrically connected to a SAR ADC module.

6. The apparatus of claim 5 wherein the common mode voltage and regulator correction module includes a phase frequency detector.

7. The apparatus of claim 6, wherein the common mode voltage and regulator correction module includes a charge pump.

8. The apparatus of claim 7, wherein the common mode voltage and regulator correction module includes a transconductance cell.

9. An apparatus for controlling supply voltage for a successive approximation register (SAR) analog to digital converter (ADC), comprising:
   means for measuring SAR conversion time;
   means for comparing the SAR conversion time to a desired conversion time; and
   means for adjusting in closed loop fashion at least one of a supply and comparator common mode voltage.

10. The apparatus of claim 9 wherein the means for adjusting in closed loop fashion at least one of a supply and comparator common mode voltage includes means for adjusting both the supply and comparator common mode voltages.

11. The apparatus of claim 9 wherein the means for adjusting in closed loop fashion at least one of a supply and comparator common mode voltage includes means for adjusting the supply voltage.

12. The apparatus of claim 9 wherein the means for adjusting in closed loop fashion at least one of a supply and comparator common mode voltage includes means for adjusting the comparator common mode voltage.

13. A non-transitory computer-readable medium, comprising instructions, which when executed by a processor cause the processor to perform the steps of:
   measuring a SAR conversion time;
   comparing the SAR conversion time to a desired conversion time; and
   adjusting in closed loop fashion at least one of a supply and comparator common mode voltage.

14. The non-transitory computer-readable medium of claim 13, further comprising instructions for adjusting in closed loop fashion both the supply and the comparator common mode voltage.

15. The non-transitory computer-readable medium of claim 13, further comprising instructions for adjusting in closed loop fashion the supply voltage.

16. The non-transitory computer-readable medium of claim 13, further comprising instructions for adjusting in closed loop fashion the comparator common mode voltage.

* * * * *